United States Patent
Chernyshov et al.

(10) Patent No.: US 10,338,130 B2
(45) Date of Patent: Jul. 2, 2019

(54) SYSTEM AND METHOD FOR ELECTRICAL SPARK DETECTION

(71) Applicant: John Zink Company, LLC, Tulsa, OK (US)

(72) Inventors: Alex Chernyshov, Lisle, IL (US); Reichl B. Haskell, Lisle, IL (US); Marko Spiegel, Lisle, IL (US); Andrew Strong, Tulsa, OK (US)

(73) Assignee: Chentronics, LLC, Norwich, NY (US)

( * ) Notice: Subject to any disclaimer, the term of this patent is extended or adjusted under 35 U.S.C. 154(b) by 14 days.

(21) Appl. No.: 15/628,894

(22) Filed: Jun. 21, 2017

(65) Prior Publication Data

US 2017/0363677 A1    Dec. 21, 2017

Related U.S. Application Data

(60) Provisional application No. 62/352,902, filed on Jun. 21, 2016.

(51) Int. Cl.
*G01R 31/28* (2006.01)
*G01R 1/44* (2006.01)
(Continued)

(52) U.S. Cl.
CPC ......... *G01R 31/2829* (2013.01); *F23Q 3/006* (2013.01); *F23Q 23/02* (2013.01); *G01R 1/44* (2013.01); *G01R 35/005* (2013.01); *H01T 13/58* (2013.01); *F23N 2027/36* (2013.01); *F23N 2031/12* (2013.01)

(58) Field of Classification Search
None
See application file for complete search history.

(56) References Cited

U.S. PATENT DOCUMENTS

| 4,500,977 A | 2/1985 | Gelhard |
| 4,636,777 A | 1/1987 | Skerritt et al. |

(Continued)

FOREIGN PATENT DOCUMENTS

| JP | 5662891 B2 | 2/2015 |
| WO | WO9724742 A1 | 7/1997 |
| WO | WO03044516 A1 | 5/2003 |

OTHER PUBLICATIONS

Extended European Search Report, for corresponding European Application No. 17176990.4, Received on Feb. 8, 2018, 8 pages.

*Primary Examiner* — Douglas X Rodriguez

(57) ABSTRACT

A spark detector indicates the presence of a spark by analyzing sound waves generated when an electrical spark is produced from an electrical spark generator located on an igniter rod. The spark detector includes an acoustic sensor that is in communication with the igniter rod to determine the time for the spark sound wave to travel through the igniter rod to the acoustic sensor. If a spark is not detected, the spark detector may output a signal indicating at least one of (i) the spark was not detected, (ii) to replace the electrical spark generator immediately, or (iii) replace the electrical spark generator soon such as at the next scheduled maintenance. Furthermore, the spark detector may be calibrated based on current temperature of the igniter rod based upon time of propagation of a pulse sound wave, generated by a pulse-echo generator, to reflect off an end of the igniter rod.

21 Claims, 7 Drawing Sheets

(51) Int. Cl.
*G01R 35/00* (2006.01)
*F23Q 3/00* (2006.01)
*F23Q 23/02* (2006.01)
*H01T 13/58* (2011.01)

(56) References Cited

U.S. PATENT DOCUMENTS

| | | | |
|---|---|---|---|
| 5,390,648 A * | 2/1995 | Yanase | F02B 77/00 |
| | | | 123/634 |
| 5,790,039 A | 8/1998 | Palara et al. | |
| 6,492,818 B1 | 12/2002 | Downs | |
| 8,523,560 B2 | 9/2013 | Anderson et al. | |
| 8,747,102 B2 | 6/2014 | Boguszewski et al. | |
| 2007/0019182 A1 * | 1/2007 | Grodzins | G01N 21/1702 |
| | | | 356/72 |
| 2010/0211348 A1 * | 8/2010 | Gray | G01R 31/11 |
| | | | 702/124 |
| 2011/0247604 A1 | 10/2011 | Anderson et al. | |
| 2014/0049248 A1 | 2/2014 | Lu et al. | |
| 2014/0065915 A1 | 3/2014 | Kyuno et al. | |
| 2015/0061696 A1 | 3/2015 | Dahmani et al. | |
| 2015/0198650 A1 | 7/2015 | Heiries et al. | |
| 2015/0322863 A1 | 11/2015 | Burke et al. | |
| 2015/0340846 A1 | 11/2015 | Schultz et al. | |
| 2017/0089577 A1 * | 3/2017 | DeSilva | F02C 7/266 |

* cited by examiner

SYSTEM AND METHOD FOR ELECTRICAL SPARK DETECTION

CROSS-REFERENCE TO RELATED APPLICATIONS

This application claims the benefit of U.S. Provisional Application No. 62/352,902 filed Jun. 21, 2016, which is hereby incorporated by reference.

BACKGROUND

High energy spark, or electrical arc, ignition systems deliver electric arcs to a gapped anode/cathode electrode set on a spark igniter for the purpose of igniting fuel in a burner. Loss of spark at the igniter electrode gap results in a no-start condition in a burner, and where raw fuel is introduced during such a no-start condition, a dangerous and potentially explosive situation can arise in the burner. Thus, detection of sparks on the spark igniter gapped electrode before introduction of fuel is desirable in an effort to reduce the dangers associated with raw fuel introduction into a burner.

SUMMARY

A spark detector analyzes a spark sound wave generated by an electrical spark, produced from electrical spark generator located on an igniter rod, to determine presence of the spark. The spark detector includes an acoustic sensor that is in communication with the igniter rod to determine the time of flight for the spark sound wave to travel through the igniter rod to the acoustic sensor. The spark detector may output a signal indicating a spark characteristic, such as successful or unsuccessful spark. If a spark is not detected, the spark detector may output a signal indicating at least one of (i) the spark was not detected, (ii) to replace the electrical spark generator immediately, or (iii) replace the electrical spark generator soon such as at the next scheduled maintenance. Furthermore, the spark detector may be calibrated based on current temperature of the igniter rod based upon time of flight of a pulse sound wave, generated by a pulse-echo generator, reflecting off of an end of the igniter rod.

In one aspect, an electrical spark detection system comprises an acoustic sensor adapted to sense a spark sound wave generated by an electrical spark, the spark sound wave propagating through an igniter rod in acoustic communication with the acoustic sensor. The electrical spark detection system may further comprise a spark detector, in communication with the acoustic sensor, adapted to: (a) identify a first time period when the ignition signal is sent to the electrical spark generator, (b) identify a second time period defining when the acoustic sensor senses the sound wave, (c) identify a spark characteristic based on a temporal relationship between the first and second time periods as compared to a predetermined time range; and (d) generate an output defining the spark characteristic.

In another aspect, a method for detecting an electrical spark comprises identifying, by a spark detector, an ignition control signal instructing an electrical spark generator to create a spark. The method may further include determining if a spark sound wave is detected by an acoustic sensor, the acoustic sensor being in communication with an igniter rod, the spark sound wave propagating through the igniter rod. Further, the method may include outputting, via the spark detector, a signal indicating a spark characteristic, the spark characteristic being based on a temporal relationship of said ignition control signal and said spark sound wave and a predetermined time range.

In yet another aspect, a method for calibrating an electrical spark detector comprises generating, via a pulse-echo generator located at a first end of an igniter rod, a pulse sound wave. The method may detect a reflected pulse sound wave based on the pulse sound wave reflecting off of a second end of the igniter rod. The method may also calculate a spark detector adjustment based on a time of flight between the pulse sound wave and the reflected pulse sound wave. Further, the method may configure the electrical spark detector based on the spark detector adjustment.

DETAILED DESCRIPTION OF THE EMBODIMENTS

Figure 1:
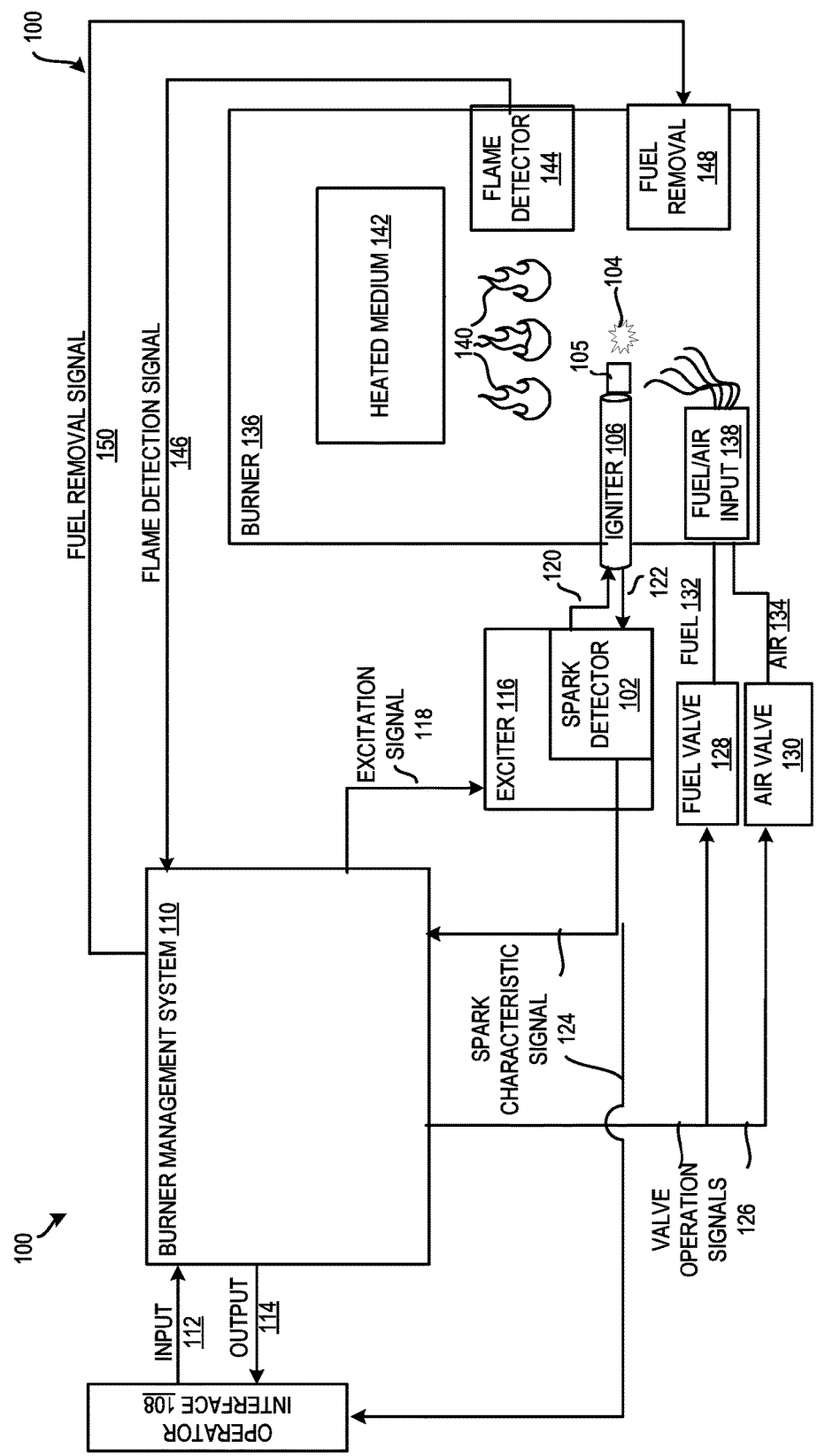
FIG. 1 depicts an exemplary burner system including a spark detector for detecting an electrical spark generated by igniter, in embodiments.

FIG. 1 depicts an exemplary burner system 100 including a spark detector 102 for detecting an electrical spark 104 generated by an electrical spark generator 105 located on an igniter 106, in embodiments. In operation of burner system 100, an operator interfaces with operator interface 108 to control, via inputs 112 and outputs 114, burner management system 110.

Burner management system 110 controls an exciter 116 by generating an excitation signal 118. Spark detector 102 may be integral to exciter 116, as shown in FIG. 1, or may be a separate component from exciter 116 in other embodiments, as discussed further below. Exciter 116 generates a control signal 120, which is detected by spark detector 102. (In embodiments, spark detector 102 can alternatively generate the control signal 120.) Control signal 120 causes electrical spark generator 105 on igniter 106 to generate spark 104. Spark detector 102 then receives igniter feedback signal 122 to determine whether spark 104 occurred as intended.

Based on the temporal relationship between when the control signal 120 is generated and when a spark sound wave is sensed, as indicated within the igniter feedback signal 122, the spark detector 102 may generate a spark characteristic signal 124. In embodiments, a spark characteristic (as can be conveyed by spark characteristic signal 124) indicates at least one of a successful spark, an unsuccessful spark, a location of a detected spark within an igniter rod, and a ratio of successful sparks to unsuccessful sparks. If igniter feedback signal 122 indicates one or more of (i) the electrical spark generator 105 on igniter 106 did not produce spark 104, (ii) the electrical spark generator 105 on igniter 106 has reached the end of its lifecycle, and (iii) the electrical spark generator 105 on igniter 106 is near the end of its lifecycle, spark detector 102 may return spark characteristic signal 124 to operator interface 108 (or to burner management system 110 in embodiments) indicating to replace the electrical spark generator 105. Additional details of fault characteristic signal 124, and the algorithms for determining when to send such signal are discussed below.

If igniter feedback 122 indicates that spark 104 is generated by electrical spark generator 105 on igniter 106, then burner management system 110 may generate valve operation signals 126 to control operation of one or more of fuel valve 128 and air valve 130, thereby letting fuel 132 and air 134 enter into a burner 136 via fuel/air input 138. Air valve 130, and air 134 through fuel/air input 138 may not be needed in embodiments where burner 136 is naturally aspirated.

Once fuel 132 and air 134 enter into burner 136, they are ignited by spark 104, which may be the same spark 104 as discussed above, or a secondary spark that is generated after igniter feedback signal 122 is generated. In turn, the fuel 132 is ignited and turns into flame(s) 140 thereby heating whatever medium 142 is within burner 136.

In embodiments, burner 136 may include a flame detector 144 for determining the presence of flame(s) 140. If flame(s) 140 is detected (or, in embodiments, if a flame is not detected), flame detector 144 may send a flame detection signal 146 to burner management system 110.

Embodiments may include a fuel removal system 148 for rapidly removing fuel 132 from within burner 136. Fuel removal system 148 may be activated based on fuel removal signal 150 generated by burner management system 110. Fuel removal signal 150 may be generated when fuel 132 has been fed into burner 136 for a predetermined period of time (or a predetermined amount of fuel 132 has entered burner 136) and igniter 106 is not generating spark 104, as detected by igniter feedback signal 122. Additionally or alternatively, fuel removal signal 150 may be generated when flame detector 144 fails to detect flames 140, as indicated by flame detection signal 146.

Figure 2:
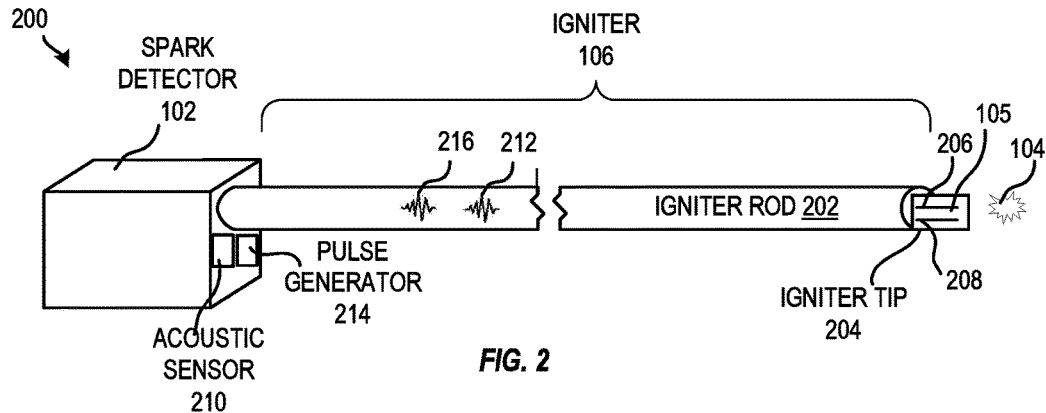
FIG. 2 depicts an exemplary diagram providing additional details of the spark detector and igniter of FIG. 1, in embodiments.

FIG. 2 depicts an exemplary diagram 200 providing additional details of spark detector 102 and igniter 106 of FIG. 1, as contemplated by embodiments. Igniter 106 couples to the housing of spark detector 102 at a first end of igniter rod 202. Igniter rod 202 may be directly coupled to the housing, or may be intermediately coupled to the housing via a harness (not shown). Igniter rod 202 may be rigid and made of steel, or other alloy material. At the opposite end of igniter rod 202 is igniter tip 204. Igniter tip 204 may include electrical spark generator 105 which, in embodiments, may include a cathode 206 and an anode 208 such that when control signal 120 is sent to the electrical spark generator 105, an arc is created between cathode 206 and anode 208. Alternatively, the electrical spark generator 105 on igniter tip 204 may include an insulating surface igniter (not shown). The electrical spark generator 105 may be located at other locations than igniter tip 204 without departing from the scope hereof. Referring back to FIG. 1, electrical spark generator 105 on igniter tip 204 may be in communication with exciter 116 such that the electrical spark generator 105 is activated in response to control signal 120 to generate spark 104.

Referring again to FIG. 2, an acoustic sensor 210 may be coupled to (or at least in acoustic communication with) igniter rod 202 to sense acoustic signals such as a spark sound wave 212 produced by spark 104 that travels through igniter rod 202. Acoustic sensor 210 may be a piezoelectric transducer which senses the acoustic signature of the spark sound wave 212. The spark 104 occurs at a specific point on the igniter rod 202 and the spark sound wave 212 propagates through the material of the igniter rod 202 and potentially any flexible harness/wire(s) leading to spark detector 102. The acoustic sensor 210 may be located on the housing of spark detector 102, such as near where igniter rod 202 attaches thereto, or alternatively acoustic sensor 210 may be placed directly on the igniter rod 202.

There is a delay in time between the moment spark 104 occurs and the spark sound wave 212 propagates down the ignition rod 202 reaching the sensor. In embodiments, this time delay is anywhere from the microsecond range to the millisecond range based on igniter rod 202 length and material, as well as other possible intermediary acoustic signal transmission mediums such as any flexible harness/wire(s) leading to spark detector 102. The time delay may be calculated based on the speed of sound in the material of igniter rod 202. For example, where igniter rod 202 is made from steel, spark sound wave 212 travels approximately at 5900 m/s. In embodiments, igniter rod 202 may be any length including from a foot or less to over 1000 feet.

In should be understood that, as the igniter rod 202 is utilized in burner 136 (referring to FIG. 1) or another system, the temperature of igniter rod 202 may change. As the temperature of igniter rod 202 changes, the speed at which spark sound wave 212 travels through igniter rod 202 may also change. To account for this, embodiments envision that spark detector 102 may further include a pulse-echo generator 214 for generating pulse sound wave 216. Pulse sound wave 216 bounces off of the igniter tip 204 (or the end of the igniter rod 202) and reflects back to pulse-echo generator and acoustic sensor 210. In turn, acoustic sensor 210 may acquire the pulse sound wave 216 signature and such data may be used to calibrate, or recalibrate, spark detector 102.

Figure 3:
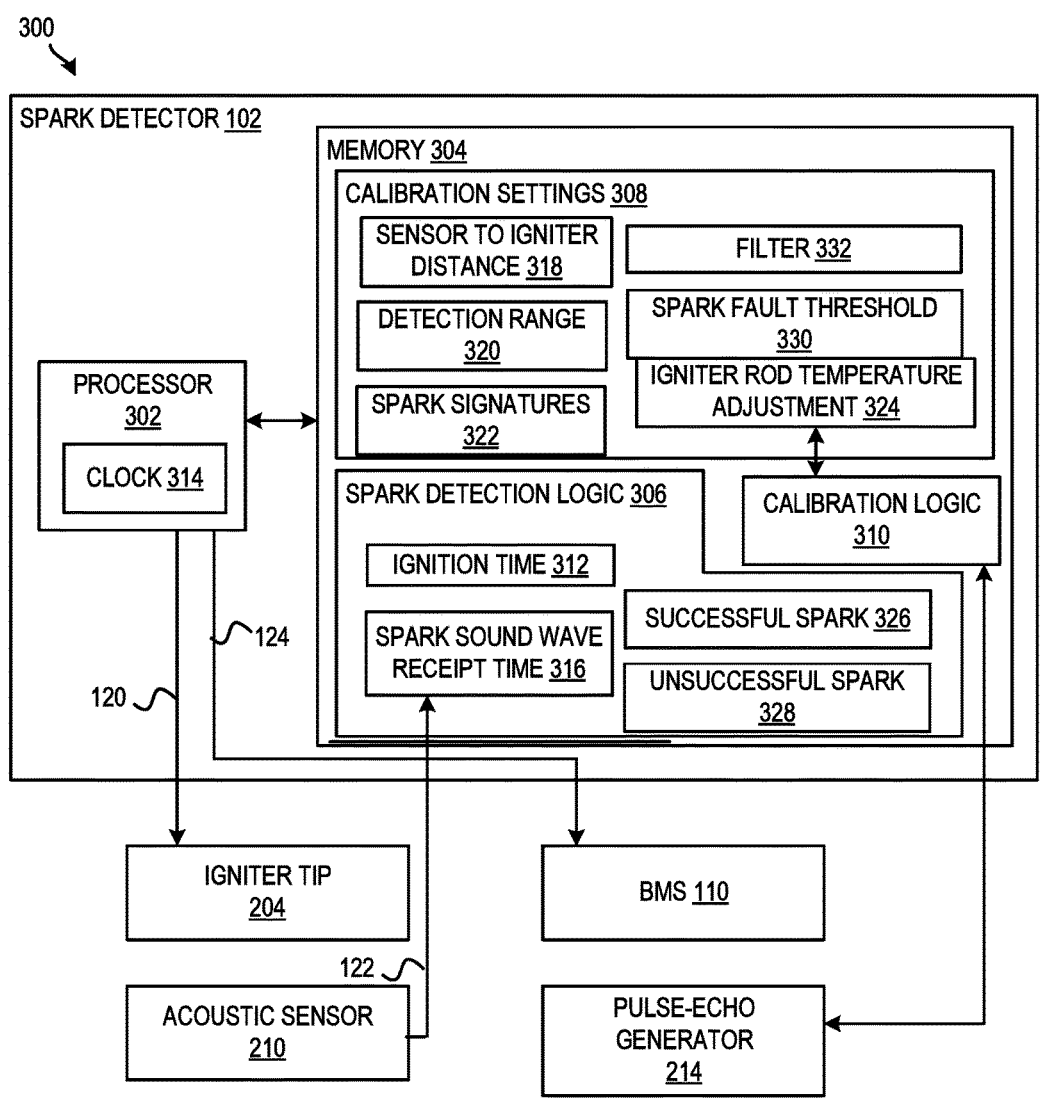
FIG. 3 depicts a block diagram of the spark detector of FIGS. 1-2, in embodiments.

FIG. 3 depicts a block diagram 300 of more detailed embodiments of spark detector 102. Referring to FIG. 3 (in conjunction with FIGS. 1 and 2), spark detector 102 includes processor 302 coupled with non-transitory memory 304 storing computer readable instructions that when executed by processor 302 perform the functionality of spark detector 102 as described herein. In embodiments, memory 304 stores spark detection logic 306, calibration settings 308, and calibration logic 310.

Spark detection logic 306 enables functionality of spark detector 102 for detecting spark 104. When executed by processor 302, spark detection logic 306 generates control signal 120 to ignite electrical spark generator 105, such as by creating spark 104 between cathode 206 and anode 208. Spark detection logic 306 records the ignition time 312 defined by the time at which control signal 120 is generated. Ignition time 312 may be based upon clock 314 of processor 302. Alternatively ignition time 312 may be based on a transducer on the wire on which control signal 120 propagates such that, when control signal 120 passes through the wire, the transducer generates an output signal.

Igniter feedback signal 122 is then stored in memory 304 as spark sound wave receipt time 316 indicating the time at which acoustic sensor 210 sensed spark sound wave 212. In particular, spark sound wave receipt time 316 is generated via the processor 302 monitoring the signal generated by acoustic sensor 210. When said signal indicates that spark sound wave 212 is detected, for example based on a specific pattern in the signal matching the spark sound wave 212, the time on the clock 314 is stored as spark sound wave receipt time 316. This spark sound wave receipt time 316 may be adjusted based on processing and signal transmission delays required by processor 302. Spark detection logic 306 then in turn compares ignition time 312 with spark sound wave receipt time 316 to determine whether spark 104 occurred properly. Determining whether spark 104 occurred properly may be based on sensor to igniter distance 318 stored within memory 304, for example, within calibration settings 308. Knowledge of the sensor to igniter distance 318 enables spark detection logic 306 to have an understanding of how long it should take spark sound wave 212 to propagate through igniter rod 202 from electrical spark generator 105 and reach acoustic sensor 210. If the difference in time between ignition time 312 and spark sound wave receipt time 316 is within a specified detection range 320, which is based on sensor to igniter distance 318 and the speed of sound travel through the material that forms igniter rod 202, then a spark is successfully detected and processor 302 may output spark characteristic signal 124 indicating a successful spark. However, if the difference in time between ignition time 312 and spark sound wave receipt time 316 is outside specified detection range 320, the processor 302 may output spark characteristic signal 124 indicating an unsuccessful spark to burner management system 110 or directly to operator interface 108. Thus, it should be appreciated that embodiments envisioned herein may only detect 1) successful sparks, 2) unsuccessful (or lack of) sparks, or 3) successful and unsuccessful (or lack of) sparks, and output a spark characteristic signal 124 based thereon.

In embodiments, spark detection logic 306 may also be capable of detecting whether and where a short circuit occurs along the leads that control electrical spark generator 105 (e.g. the leads leading to cathode 206 and anode 208). For example, spark signatures 322 may be included that define various spark signatures of short circuit sounds. These spark signatures 322 may be preloaded into calibration settings 308. Spark signatures 322 may also include rules for identifying an exact location of the short circuit based upon time of the spark sound wave 212 reaching acoustic sensor 210. For example, if the spark sound wave 212 reaches acoustic sensor 210 outside of detection range 320, there is a strong probability that that spark sound wave 212 was not generated by the electrical spark generator 105, but instead was generated by a short circuit in the igniter rod 202. Therefore, spark signatures 322 may define the distance along the igniter rod 202 that the short circuit occurred based upon comparing when the time control signal 120 is generated to the time acoustic sensor 210 senses the short circuit spark sound wave. In other words, embodiments may determine a location of the short circuit based upon timing calculations between generation of control signal 120 and receipt of spark sound wave 212.

As discussed above, temperature of igniter rod 202 may influence the speed at which sound wave 212 travels through igniter rod 202. Therefore, embodiments envision that spark detector 102 may include calibration logic 310. Calibration logic 310, when executed by processor 302, controls pulse-echo generator 214 to generate pulse sound wave 216, as shown in FIG. 2. Acoustic sensor 210, (or in alternate embodiments) pulse-echo generator 214) then detects the pulse sound wave 216 after it reflects off of igniter tip 204. Using sensor to igniter distance 318 (if the acoustic sensor 210 detects the reflected pulse sound wave 216), calibration logic can then generate igniter rod temperature adjustment 324. Igniter rod temperature adjustment 324 serves as an adjustment multiplier that may be used by spark detection logic 306 to readjust detection range 320 if the temperature of the igniter rod 202 affects the speed of the spark sound wave 212 as it travels through the igniter rod 202.

In embodiments, spark detection logic 306 may also be utilized to identify the remaining lifespan of electrical spark generator 105. For example, spark detection logic 306 may catalog successful sparks 326 and unsuccessful sparks 328. Successful sparks 326 occur when acoustic sensor 210 senses spark sound wave 212 within detection range 320. Unsuccessful sparks 328 occur when acoustic sensor 210 does not sense spark sound wave 212 within detection range 320. The ratio of successful sparks 326 to unsuccessful sparks 328 may then be compared against spark fault threshold 330. Spark fault threshold 330 defines the percentage of successful sparks 326 to unsuccessful sparks 328 that indicates whether the electrical spark generator 105 needs to be replaced. One such example ratio is 75% successful sparks. Additionally, spark fault threshold 330 may identify the percentage of successful sparks 326 to unsuccessful sparks 328 that indicates whether the electrical spark generator 105 needs to be replaced soon. One such ratio is 80% successful sparks. The various ratios defined by spark fault threshold 330 may be higher or lower than 75% (for immediate replacement indication) or 80% (for replacement soon indication), without departing from the scope hereof. Further, in certain embodiments, fuel 132 may not be allowed to enter the burner 136 unless the ratio of successful sparks 326 to unsuccessful sparks 328 is above a certain threshold.

Various electrical spark generators operate at different frequencies, from 0.1 Hz to over 120 Hz. Therefore, by monitoring the successful sparks compared to unsuccessful sparks, the operator is able to predict when the electrical spark generator 105 needs to be replaced.

Thus, if the percentage of successful sparks 326 to unsuccessful sparks 328 indicates that the electrical spark generator needs to be replaced immediately, processor may output spark characteristic signal 124 to burner management system 110 (or directly to operator interface 108) indicating that the electrical spark generator 105 needs to be replaced immediately. Thereafter, the operator (or burner management system 110) may shut down burner 136 allowing for the immediately replacement of electrical spark generator 105. Alternatively, if the percentage of successful sparks 326 to unsuccessful sparks 328 indicates that the electrical spark generator 105 needs to be replaced soon, processor 302 may output spark characteristic signal 124 to burner management system 110 (or directly to operator interface 108) indicating that the electrical spark generator 105 needs to be replaced soon. Thereafter, the operator may replace the electrical spark generator 105 at the next planned maintenance.

In embodiments, calibration settings 308 may additionally include filter 332 that operates to filter the signals received from acoustic sensor 210. Where the electrical spark generator 105 operates at a high operating frequency, multiple sparks may be detected in close temporal proximity to one another. Moreover, signals propagating through igniter rod 202 may bounce off of various surfaces of the igniter rod 202. Therefore, in embodiments, filter 332 may be utilized to advantageously filter signals when there are a multitude of signals propagating through igniter rod 202. For example, where a short circuit occurs within, but distant from the igniter tip 204 of igniter rod 202, the sound wave created thereby will travel in both directions from the spark (i.e. towards both ends of the igniter rod 202). The wave that propagates away from the sensor 210 will hit the igniter tip 204 of the igniter rod 202 and reflect back towards the sensor 210. However, said sound wave will arrive at sensor 210 later than its counterpart waveform which initially travels from the short circuit directly to the sensor 210. If consideration is not taken for this later-arriving wave, confusion may result regarding the precise status of the spark. Filter 332 may thus be used to filter out these reflected short circuit sound waves based on timing of the received signal.

Figure 4:
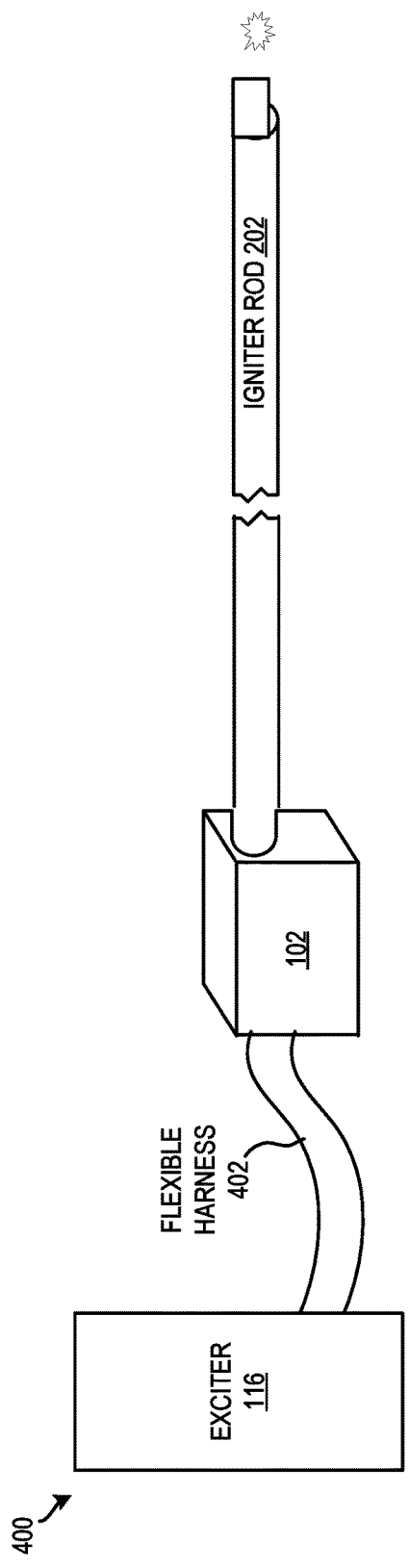
FIG. 4 depicts a block diagram of the physical relationship between the spark detector and exciter of FIGS. 1-3, in embodiments.

FIG. 4 depicts a block diagram 400 of embodiments of the physical relationship between spark detector 102 and exciter 116. Spark detector 102 may be a separate device from exciter 116 and coupled thereto via flexible harness 402, for example.

Figure 5:
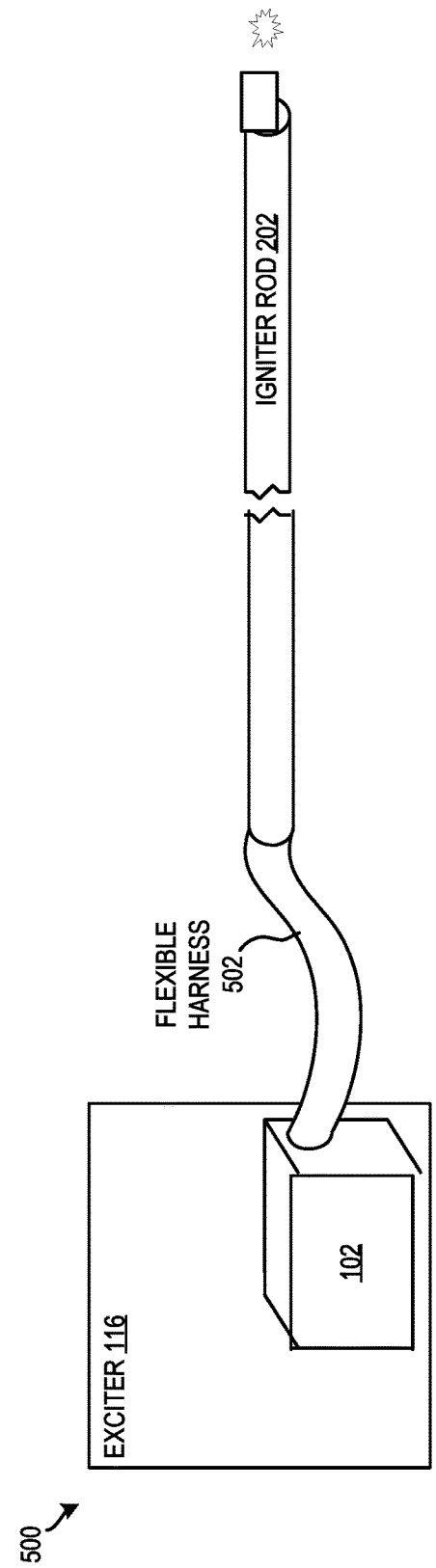
FIG. 5 depicts a block diagram of the physical relationship between the spark detector and exciter of FIGS. 1-3, in alternate and overlapping embodiments.

FIG. 5 depicts a block diagram 500 of the physical relationship between spark detector 102 and exciter 116, in other embodiments. As shown, spark detector 102 may be integral with exciter 116. Moreover, igniter rod 202 may be coupled with spark detector via a flexible harness 502, which may be similar to flexible harness 402. It should be appreciated that other physical relationships between exciter 116 and spark detector 102 may be implemented without departing from the scope hereof. For example, spark detector 102 may be integral to exciter 116, and igniter rod 202 may couple directly to spark detector 102 without flexible harness 502.

Figure 6:
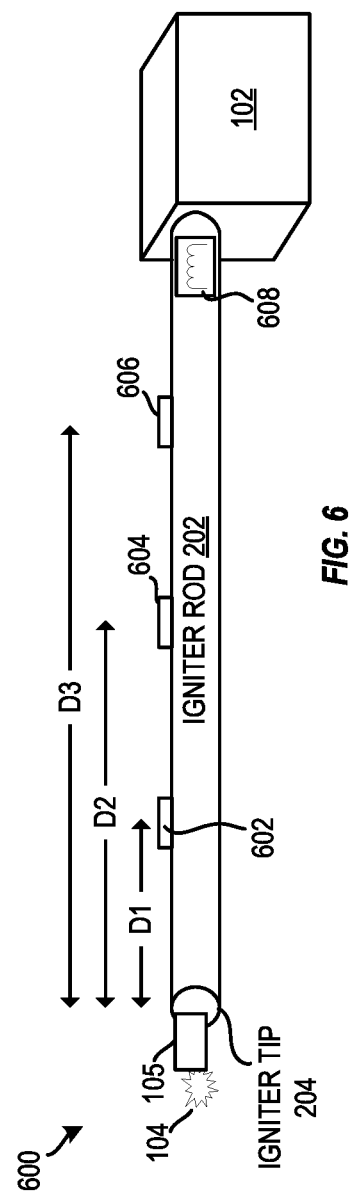
FIG. 6 depicts a block diagram of the spark detector module of FIGS. 1-3 coupled with igniter rod having a plurality of acoustic sensors located thereon, in embodiments.
Figure 7:
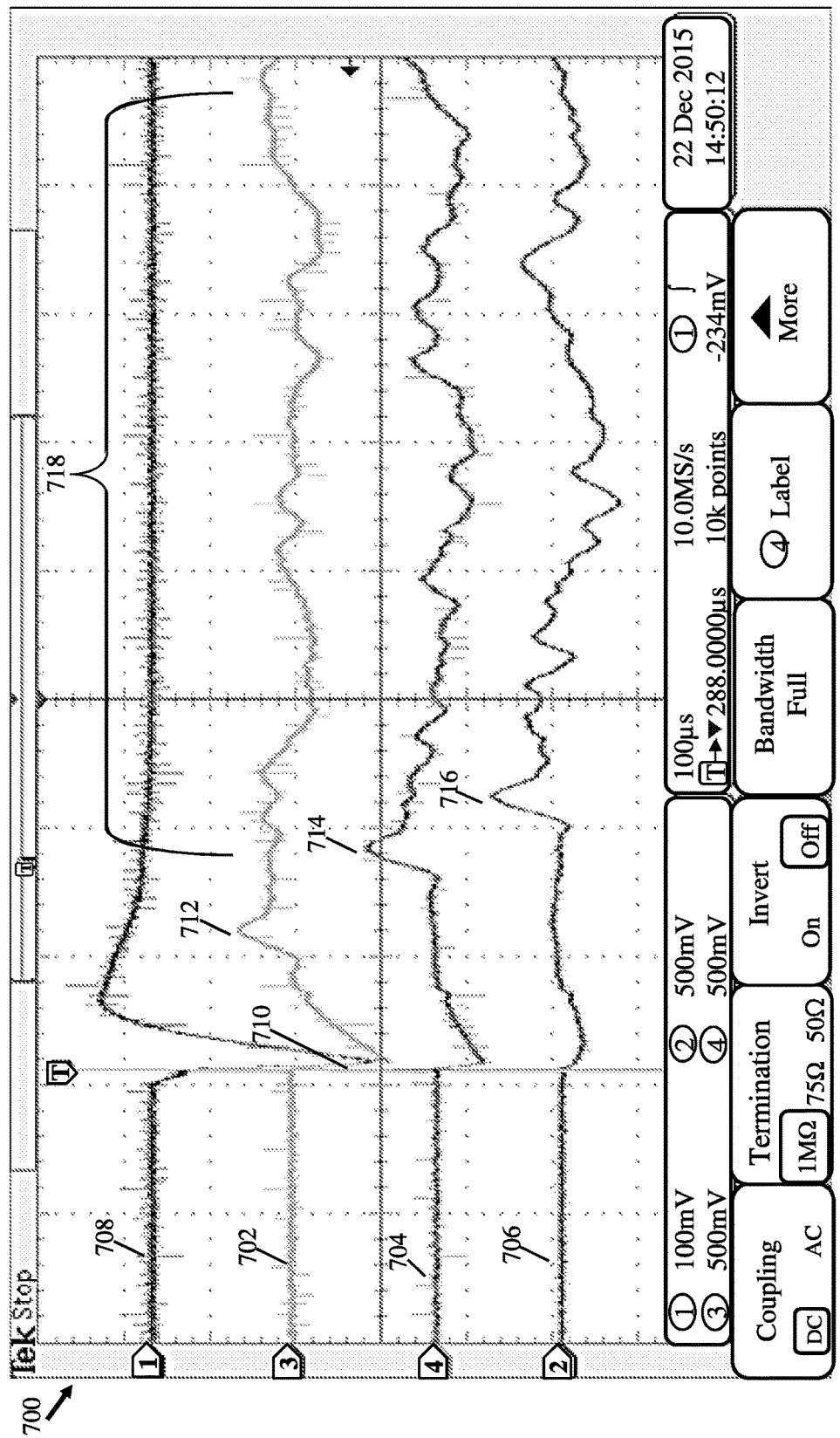
FIG. 7 depicts an exemplary signal diagram showing the spark sound wave signals sensed by each of the plurality of acoustic sensors of FIG. 6.

FIG. 6 depicts a block diagram 600 showing embodiments of spark detector 102 coupled with igniter rod 202 having a plurality of acoustic sensors located thereon. FIG. 7 depicts an exemplary signal diagram 700 showing the spark sound wave signals sensed by each of the plurality of acoustic sensors of FIG. 6. FIGS. 6 and 7 are best viewed together with the following discussion.

A first sensor 602 is located a distance D1 from igniter tip 204. A second sensor 604 is located a distance D2 from igniter tip 204. And a third sensor 606 is located a third distance D3 from igniter tip 204. A transducer 608 is located at the opposite end of igniter rod 202 from igniter tip 204. Transducer 608 operates to detect a signal traveling to the electrical spark generator 105 (e.g. cathode and anode or insulating surface igniter) located on igniter tip 204. It should be appreciated that transducer 608 may not be required where the igniter control signal is detectable based on the processor that sends the signal.

In signal diagram 700, first acoustic sensor 602 produces first signal 702. Second acoustic sensor 604 produces second signal 704. Third acoustic sensor 606 produces third signal 706. And transducer 608 produces transducer signal 708. Transducer signal 708 is representative of control signal 120 of FIG. 1. Each of first, second, and third signals 702, 704, and 706, respectively, are representative of igniter feedback signal 122 of FIG. 1. Valley 710 of transducer signal 708 indicates when control signal is sent to the electrical spark generator 105 to produce spark 104. It should be appreciated that valley 710 may be reversed, or in other words become a peak, based on the configuration of the transducer 608 without departing from the scope hereof. Peak 712 of first signal 702 indicates when the spark sound wave (e.g. spark sound wave 212), traveling through the igniter rod 202, is sensed by first acoustic sensor 602. Peak 714 of second signal 704 indicates when the spark sound wave (e.g. spark sound wave 212), traveling through the igniter rod 202, is sensed by second acoustic sensor 604. Peak 716 of third signal 706 indicates when the spark sound wave (e.g. spark sound wave 212), traveling through the igniter rod 202, is sensed by third acoustic sensor 606.

If filters 332 (of FIG. 3) are applied by spark detection logic 306, the filter may filter out additional information from signals 702-706 that occurs after each of valley 710 and peaks 712-716, respectively. For example, the additional oscillation 718 may be filtered out by filter 332.

Figure 8:
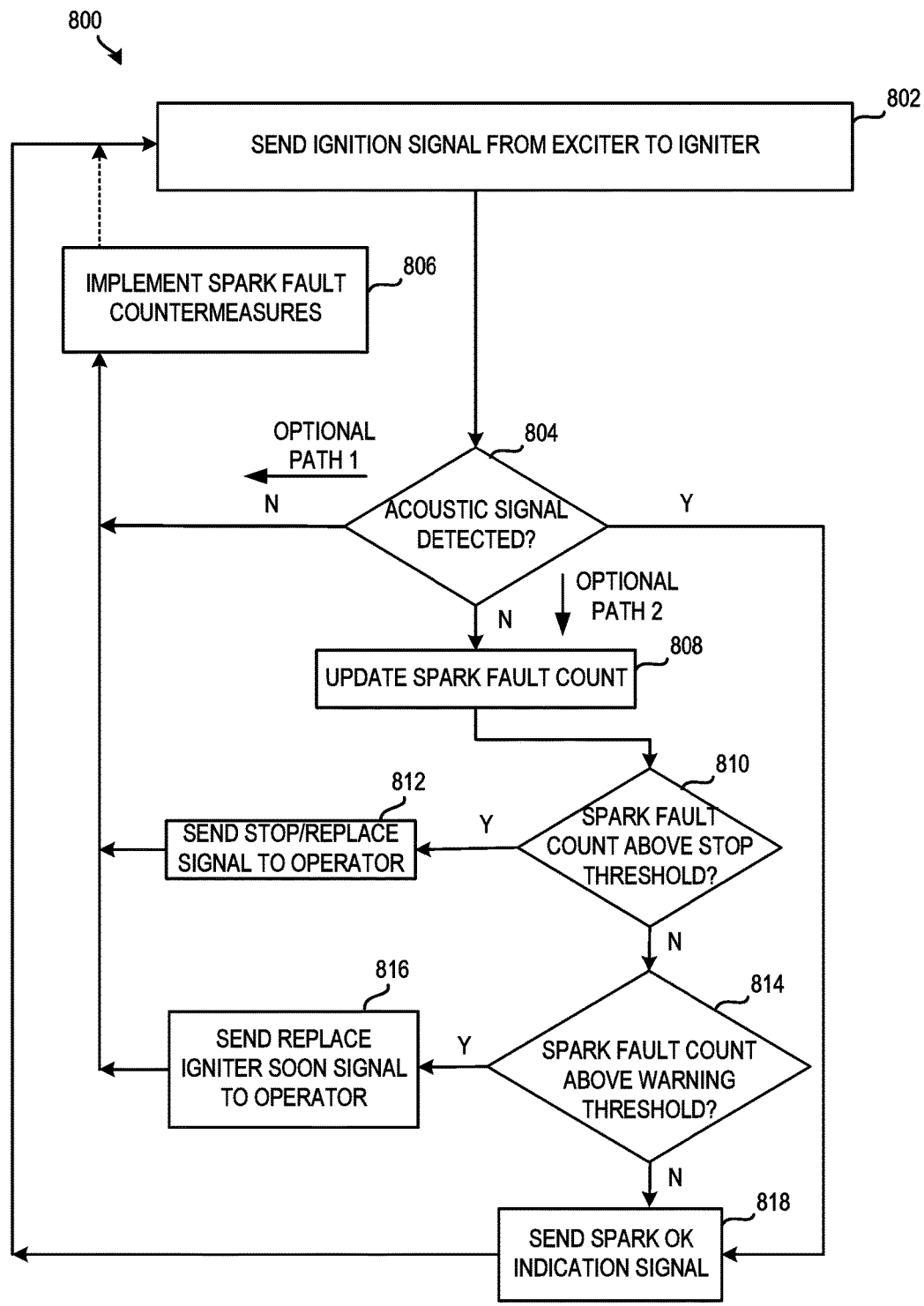
FIG. 8 depicts an exemplary method for detecting a spark produced by an igniter, in embodiments.

FIG. 8 depicts embodiments for an exemplary method 800 for detecting a spark produced by an igniter. Method 800 may be implemented, for example, using spark detector 102 in communication with acoustic sensor 210 which is coupled with igniter rod 202, as shown in FIG. 2.

In step 802, method 800, sends an ignition signal from the exciter to the igniter. In one example of operation of step 802, control signal 120 is sent to electrical spark generator 105 to create spark 104.

Step 804 is a decision in which method 800 determines if an acoustic signal travelling through the igniter rod 202 is detected. If a spark is detected, method 800 proceeds to step 818, if included, or repeats step 802. If a spark is not detected, method 800 proceeds with either path 1 to step 806, or path 2 to step 808. Path 1 may be taken where the system operating method 800 does not monitor electrical spark generator lifespan. Path 2 may be taken where the system operating method 800 is also used to monitor electrical spark generator lifespan. In one example of operation of step 804, acoustic sensor 210 is utilized to sense spark sound wave 212 and generates igniter feedback signal 122. If igniter feedback signal 122 indicates that spark sound wave 212 was detected within detection range 320, then spark detection logic 306 identifies a spark. If igniter feedback signal 122 indicates that spark sound wave 212 was not detected within detection range 320, then spark detection logic 306 identifies an unsuccessful (i.e., lack of) spark. If an unsuccessful spark is identified at decision 804, processor 302 may output spark characteristic signal 124 to burner management system 110, or directly to operator interface 108, indicating an unsuccessful spark.

In step 806, embodiments of method 800 contemplate implementing spark fault countermeasure(s). In one embodiment of operation of step 806, spark fault counter measure includes activation of fuel removal system 148 to remove any residual fuel 132 within burner 136. Additionally, or alternatively, the spark fault counter measure may include one or more of replace electrical spark generator 105 igniter 106, exciter 116, or spark detector 102, and perform system diagnostics. After step 806, method 800 repeats step 802.

In embodiments where step 808 is implemented, method 800 updates a spark fault count. In one example of operation of step 808, spark detection logic 306 increases the unsuccessful spark 328 count. Method 800 then proceeds with step 810. In embodiments, method 800 can alternatively proceed directly to step 814, 806 or repeat step 802.

Step 810 is a decision. In step 810, method 800 determines if the spark fault count is above a stop threshold. If the spark fault count is determined to be above a stop threshold, method 800 proceeds to step 812. If the spark fault count is determined to be below the stop threshold, method 800 proceeds to step 814, or, in embodiments, directly to step 818 or repeats step 802.

In one example of operation of step 810, spark detection logic 306 analyzes the ratio of unsuccessful sparks 328 to successful sparks 326 to determine if the ratio is above spark fault threshold 330, which indicates when an electrical spark generator has reached the end of its lifespan.

In step 812, method 800 outputs a stop/replace signal to the operator. In one example of step 812, spark characteristic signal 124 is sent to burner management system 110, or directly to operator interface 108, indicating that electrical spark generator 105 needs to be immediately replaced.

Step 814 is a decision. In step 814, method 800 determines of the spark fault count is above a warning threshold. If the spark fault count is determined to be above a warning threshold, method 800 proceeds to step 816. If the spark fault count is determined to be above the warning threshold, method proceeds to step 818, or, in embodiments directly repeats step 802.

In one example of operation of step 814, spark detection logic 306 analyzes the ratio between unsuccessful sparks 328 and successful sparks 326 to determine if the ratio is above spark fault threshold 330, which indicates when an electrical spark generator is about to reach the end of its lifespan.

In step 816, method 800 outputs a replace igniter soon signal to the operator. In one example of step 816, spark characteristic signal 124 is sent to burner management system 110, or directly to operator interface 108, indicating that electrical spark generator 105 needs to be replaced at the next burner maintenance performance.

In step 818, method 800 sends a spark OK indication signal to the operator (or the burner management system in embodiments). In one example of operation, spark characteristic signal 124, of FIG. 1, is sent to burner management system 110, or directly to operator interface 108, indicating a successful spark.

Method 800 repeats for each spark control signal sent to the electrical spark generator 105. However, in certain embodiments, method 800 may only be performed for a portion of the spark control signals. For example, where the electrical spark generator 105 operates at 0.1 Hz, or 1 spark per 10 seconds, only one spark may be subjected to method 800 each second. Alternatively, 2 or more sparks may be subjected to method 800 each second.

It should be understood that embodiments herein contemplate that any number of the steps depicted in FIG. 8 may be removed, revised or supplemented without departing from the scope hereof.

Figure 9:
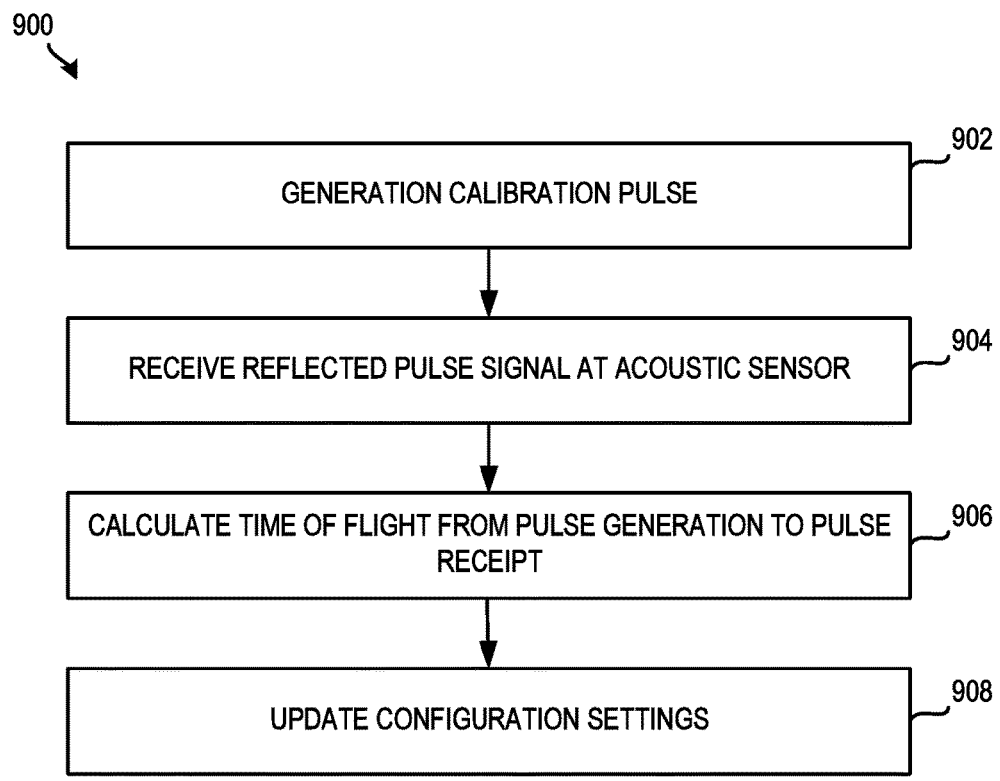
FIG. 9 depicts an exemplary method for calibrating a spark detector, in embodiments.

FIG. 9 depicts embodiments of an exemplary method 900 for calibrating a spark detector. Method 900 is for example implemented using pulse-echo generator 214 and spark detector 102, of FIG. 2.

In step 902, method 900 generates a calibration pulse for determining one or more calibration settings of the spark detector. In one example of operation of method 900, pulse-echo generator 214 generates pulse sound wave 216 within igniter rod 202.

In step 904, method 900 receives a reflected pulse signal at an acoustic sensor. In one example of operation of step 904, the pulse sound wave 216 reflects off of the opposite end of igniter rod 202, for example off of igniter tip 204, and is detected by an acoustic sensor, which may be acoustic sensor 210 or a separate acoustic sensor associated with the pulse-echo generator 214.

In step 906, method 900 calculates the time of flight from pulse generation during step 902 to pulse receipt during step 904. In one example of step 904, calibration logic 310 determines the temporal duration between when pulse-echo generator 214 generated pulse sound wave 216 and when the acoustic sensor (either acoustic sensor 210 or an acoustic sensor associated with pulse-echo generator 214) sensed the pulse sound wave 216 reflected off of the end of igniter rod 202.

In step 908, method 900 updates the configuration settings of the spark detector. In one example of operation of step 908, calibration logic 310 updates igniter rod temperature adjustment 324 within calibration settings 308.

Method 900 may be implemented at any time during method 800 to configure spark generator according to the actual characteristics of igniter rod. This allows the igniter rod to increase in temperature during operation of the burner and still provide for an accurate detection of whether a spark occurs.

Only a small fraction of ambient sound waves enter the steel or alloy material of the igniter rod. For example, only 0.1 percent of those types of sound waves travel into the steel. Thus, the signal detected by the acoustic sensor represents the spark sound wave as opposed to the spark sound wave combined with numerous other ambient sound waves.

The above described system and method embodiments provide significant advantages. By coupling the acoustic sensor directly or indirectly to the igniter rod, the system and methods are capable of monitoring the spark sound wave as it travels through the igniter rod itself. Moreover, by coupling the spark detection to a fuel removal system, the potential for improper or dangerous fuel ignition caused when faulty sparks occur is significantly reduced.

It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:
1. An electrical spark detection system, comprising:
an acoustic sensor adapted to sense a spark sound wave generated by an electrical spark generator, the spark sound wave propagating through an igniter rod in acoustic communication with the acoustic sensor;
a spark detector, in communication with the acoustic sensor, adapted to:
(a) identify a first time period when an ignition signal is sent to the electrical spark generator,
(b) identify a second time period defining when the acoustic sensor senses the spark sound wave,
(c) identify a spark characteristic based on a temporal relationship between the first and second time periods as compared to a predetermined time range, and
(d) generate an output defining the spark characteristic; and,
a pulse-echo generator located at a first end of the igniter rod for generating a pulse sound wave;
wherein:
the acoustic sensor is adapted to sense a reflected pulse sound wave based on the pulse sound wave reflected off a second end of the igniter rod;
the spark detector is adapted to calibrate the predetermined time range based on a length of the igniter rod and a third time period defined by when the pulse sound wave is generated and the acoustic sensor senses the reflected pulse sound wave.
2. The electrical spark detection system of claim 1, the system further comprising the electrical spark generator, the electrical spark generator being located on the igniter rod.

3. The electrical spark detection system of claim 1, the spark detector further adapted to determine a location of an electrical short when the second time period is outside the predetermined time range.

4. The electrical spark detection system of claim 1, the acoustic sensor being a piezoelectric transducer.

5. The electrical spark detection system of claim 1, the igniter rod being a steel or alloy rod.

6. The electrical spark detection system of claim 1,
said (c) identify a spark characteristic including:
(c1) identify the spark characteristic as a successful spark when the second time period is within the predetermined time range, and
(c2) identify the spark characteristic as an unsuccessful spark when the second time period is outside the predetermined time range; and
repeat (a) through (d) to identify multiple successful sparks and multiple unsuccessful sparks;
said output being a warning when a ratio of unsuccessful sparks to successful sparks is above
a predefined spark fault threshold.

7. The electrical spark detection system of claim 6, the warning indicating to replace the electrical spark generator immediately.

8. The electrical spark detection system of claim 6, the warning indicating to replace the electrical spark generator at a maintenance procedure.

9. The electrical spark detection system of claim 1, further including a flexible harness coupling the igniter rod to the spark detector.

10. The electrical spark system of claim 1, further including a flexible harness between the spark detector and an exciter.

11. The electrical spark system of claim 1, said spark characteristic indicating a successful spark when the second time period is within the predetermined time range.

12. The electrical spark system of claim 1, said spark characteristic indicating an unsuccessful spark when the second time period is outside the predetermined time range.

13. A method for detecting an electrical spark comprising:
identifying, by a spark detector, an ignition control signal instructing an electrical spark generator to create a spark;
determining if a spark sound wave is detected by an acoustic sensor, the acoustic sensor being in communication with an igniter rod, the spark sound wave propagating through the igniter rod;
outputting, via the spark detector, a signal indicating a spark characteristic, the spark characteristic being based on a temporal relationship of said ignition control signal and said spark sound wave and a predetermined time range,
generating, via a pulse-echo generator located on the igniter rod, a pulse sound wave;
detecting a reflected pulse sound wave based on the pulse sound wave reflecting off an end of the igniter rod;
calculating an igniter rod temperature adjustment based on a time between generating the pulse sound wave and receiving the reflected pulse sound wave; and,
adjusting the predetermined time range based on the igniter rod temperature adjustment.

14. The method of claim 13, further comprising, if the spark sound wave is not detected, increasing a spark fault count indicating the spark sound wave was not detected.

15. The method of claim 14, further comprising determining if the spark fault count is above a stop threshold; wherein if the spark fault count is above the stop threshold, a warning indicates to replace the electrical spark generator immediately.

16. The method of claim 14, further comprising determining if the spark fault count is above a warning threshold; wherein if the spark fault count is above the warning threshold, a warning indicates to replace the electrical spark generator at a future maintenance procedure.

17. The method of claim 13, further comprising outputting a spark OK indication signal if the spark sound wave is detected within the predetermined time range.

18. The method of claim 13, further comprising implementing a spark fault countermeasure if the spark is not detected within the predetermined time range.

19. The method of claim 13, the spark characteristic indicating a successful spark when the temporal relationship is such that the spark sound wave is received by the acoustic sensor within the predetermined time range.

20. The method of claim 13, the spark characteristic indicating an unsuccessful spark when the temporal relationship is such that the spark sound wave is received by the acoustic sensor outside the predetermined time range.

21. A method for calibrating an electrical spark detector comprising:
generating, via a pulse-echo generator located at a first end of an igniter rod, a pulse sound wave;
detecting a reflected pulse sound wave based on the pulse sound wave reflecting off a second end of the igniter rod;
calculating a spark detector adjustment based on a time between generating the pulse sound wave and receiving the reflected pulse sound wave, the spark detector adjustment being an igniter rod temperature adjustment; and,
configuring the electrical spark detector based on the spark detector adjustment.

* * * * *